US012666755B2

(12) United States Patent
Sinkular

(10) Patent No.: US 12,666,755 B2
(45) Date of Patent: Jun. 23, 2026

(54) OPTIMIZED ARCHITECTURE TO MAXIMIZE SOLAR CELL EFFICIENCY VIA THE OPTIMAL SPATIAL CONFIGURATION OF EXISTING OR FUTURE TRANSPARENT THIN-FILM PV MATERIALS TARGETING DIFFERENT REGIONS OF THE SOLAR SPECTRUM

(71) Applicant: Jasmin Jijina Sinkular, Bloomfield Hills, MI (US)

(72) Inventor: Jasmin Jijina Sinkular, Bloomfield Hills, MI (US)

( * ) Notice: Subject to any disclaimer, the term of this patent is extended or adjusted under 35 U.S.C. 154(b) by 0 days.

(21) Appl. No.: 17/994,209

(22) Filed: Nov. 25, 2022

(65) Prior Publication Data

US 2023/0197873 A1     Jun. 22, 2023

Related U.S. Application Data

(60) Provisional application No. 63/292,393, filed on Dec. 21, 2021.

(51) Int. Cl.
H10F 77/63     (2025.01)
H10F 19/31     (2025.01)

(52) U.S. Cl.
CPC ............. H10F 77/68 (2025.01); *H10F 19/31* (2025.01)

(58) Field of Classification Search
CPC ............................ H01L 31/0521; H10F 77/68
See application file for complete search history.

(56) References Cited

U.S. PATENT DOCUMENTS

2009/0152947 A1*   6/2009  Wang ........................ H02J 3/38
                                                             307/18

OTHER PUBLICATIONS

Ganapati et al., "Air Gaps as Intermediate Selective Reflectors to Reach Theoretical Efficiency Limits of Multibandgap Solar Cells", IEEE Journal of Photovoltaics, vol. 5, No. 1, Jan. 2015. (Year: 2015).*

* cited by examiner

*Primary Examiner* — Tae-Sik Kang

(57)     ABSTRACT

A new type of PV cell is comprised of a purposefully unique spatial configuration of multiple pairs of transparent thin PV films stacked top down in order of decreasing bandgaps corresponding to increasing wavelengths. Each thin-film pair is made of a material of desirable bandgap, and consecutive films separated from each other in space by a layer of air to force confinement of light waves of wavelength matching bandgap, enabling an infinite number of reflections until the wave energy corresponding to each desired wavelength is absorbed. The PV thin-films are coated to ensure that light of each wavelength is confined as intended. They are passivated to minimize surface recombination. This spatial arrangement provides multiple opportunities for photovoltaic conversion of each intended wavelength hence increasing overall conversion efficiency.

8 Claims, 3 Drawing Sheets

OPTIMIZED ARCHITECTURE TO MAXIMIZE SOLAR CELL EFFICIENCY VIA THE OPTIMAL SPATIAL CONFIGURATION OF EXISTING OR FUTURE TRANSPARENT THIN-FILM PV MATERIALS TARGETING DIFFERENT REGIONS OF THE SOLAR SPECTRUM

FIELD

The present application relates to a PV cell that uses the best existing or future state of the art transparent PV thin-films and combines them in a new spatial configuration that maximizes their solar energy conversion efficiency, by increasing the number of PV interactions between light of each desirable wavelength and its bandgap-matched PV material pair, and by layering the matched pairs of decreasing bandgap within a given PV cell.

BACKGROUND

Solar Cells or Photovoltaic Cells are widely used to convert the energy present in sunlight waves or photons to electricity using the photovoltaic effect. The photovoltaic effect was first discovered in 1839 by Sir Edmund Becquerel and advanced by several researchers that followed. Scientists at Bell Labs put the effect to practical use for the first time in 1954 by creating a working Si based solar cell.

Today the primary type of prior art solar cells available are as follows:

1. Semiconductor based
   a. Monocrystalline or Polycrystalline Si (conventional cells and newer thin-film cells)
   b. Conventional Si cells constitute the most common commercially available solar panels and yield good efficiency at a reasonable cost. The manufacturing process is cumbersome however, with high capex for manufacturing equipment. This type of cell includes n-type and p-type conventional Si cells. Half-cut solar cells and other newer technologies continue to try to improve the efficiencies of conventional Si cells. Amorphous-Si thin-film cells by comparison are easier to manufacture with a lower comparative capex for equipment, They are also easier to recycle.
   c. Monocrystalline or Polycrystalline 111-V (conventional cells and thin-film cells) made of materials from the Ill and V columns of the periodic table.
2. Thin-film III-V cells like CdTe are gaining in prominence in the U.S. and are being manufactured in the U.S. by FirstSolar in collaboration with NREL. They have competitive solar efficiencies and are much lower in cost, and therefore higher in Levelized Cost of Electricity (LCOE), as compared with conventional Si cells.
3. Polymer material based thin-film cells
   a. Much research is underway to develop thin-film solar cells simply from organic and inorganic polymers, e.g. Perovskites (Organic or Inorganic) and other organic polymers, by leveraging additive manufacturing, 3D printing or roll to roll printing techniques. Such manufacturing techniques can revolutionize the manufacturing of efficient solar cells by democratizing it due to the low capex entailed in these techniques.

Additionally, there is active ongoing research to discover new types of material that will facilitate the confluence of high conversion efficiencies with low manufacturing complexity and cost.

The efficiency of various solar cell materials is baselined in the following diagram by NREL:

https://www.nrei.gov/pv/cell-effiency.html

The next evolution in efficiency for prior art solar PV cells incorporates heterojunction and multijunction cells. These terms are used loosely to describe a variety of different types of cells. The more commonly available heterojunction cells sandwich a layer of crystalline Si between two layers of amorphous-Si, thus increasing the overall efficiency of the combined cell. All semiconductor materials used are Si-based with the same bandgap, but allow multiple (yet finite) traversals through the material which as a result absorbs more of the photons of one given wavelength as they traverse once from the top to the bottom layer thus slightly improving efficiency at a slightly increased cost.

Multijunction or Heterojunction solar cells that combine multiple layers of solar materials with different bandgaps yield significantly higher efficiencies as they leverage the bandgaps of several different carefully selected materials to absorb a larger fraction of the solar spectrum, hence overcoming the Shockley-Queisser efficiency limit for any one given solar cell material. Progress in research continues to be made to improve heterojunction solar cell efficiency, e.g. High efficiency silicon heterojunction solar cells: Status and perspectives (Conference)|OSTI.GOV The efficiencies of multijunction solar cells made from materials with different bandgaps are significantly higher than those of their single junction counterparts, but there are certain limitations that they must contend with:

The difficult task of combining different layers of materials with precision, both mechanically and electrically, results in significant manufacturing complexity, hence cost. E.g. Challenges for the interconnection of crystalline silicon heterojunction solar cells—PV Tech (pv-tech.org); https://pv-manufacturing.org/silicon-heterojunction-solar-cells/

And when it comes to performance, even with anti-reflective coatings on the top layer of the multijunction cell and a reflective coating at the underside of the bottom most layer, it is difficult to ensure that all (or most) of the light of a given wavelength is absorbed by the material with the appropriate bandgap that matches its wavelength. Given that light of a given wavelength only traverses each layer of target material once, there is a finite probability that it will pass through the material without promoting an electron across its bandgap, i.e. without being converted into electricity. Worse yet, once the high energy photons targeted to be absorbed by the top layer pass through it without causing excitations across its bandgap, they are likely to be absorbed by the lower layers of materials which have correspondingly lower bandgaps, hence resulting in the release of the remainder of the energy of these high energy photons, as wasted thermal energy. This thermal energy is detrimental for two reasons:

1. It represents wasted energy, causing a drop in efficiency of the multijunction solar cell
2. It decreases the efficiency of the cell further, due to the inverse relationship of cell temperatures and solar cell energy efficiency.

While sandwiching different materials together with different band gaps ensures better overall efficiency due to a greater subset of light (more wavelengths) captured, it results in a greater amount of heat accumulating and being trapped in the thicker heterojunction cell. This in turn reduces the efficiency of the cell, due to the dependence on temperature of its I-V curve. The following article touches upon similar thermal issues that arise while stringing together multiple HJT cells in a module, Key Technologies of Heterojunction Solar Cell and Module Manufacturing|MRS Online Proceedings library (OPL)|Cambridge Core Solar Cell Efficiency Assuming independent variables, the efficiency of a solar cell is a product of the corresponding efficiencies of contributing variables that impact the overall efficiency of the cell (Buonassi 2011).

$$\eta_{total} = \eta_{absorption} \times \eta_{excitation} \times \eta_{drift/diffusion} \times \eta_{separation} \times \eta_{collection}$$

This invention defines a new type of PV technology that aims to improve one or more of the efficiencies on the right-hand-side of the equation above, by enabling repeated traversals through a pair of films of the material with matched bandgap, thus resulting in a higher overall efficiency for the solar cell.

The absorption depth of a PV material is defined by the distance to which sunlight must travel within the material to generate electrons. It is the inverse of the absorption coefficient, and its value is determined by the wavelength of light involved in the PV interaction as well as the PV characteristics of the material. The absorption depth and the corresponding absorption efficiency impacts solar cell design by determining the cell thickness required to ensure efficient PV interactions. While a thicker PV material ensures a greater probability that all the light of the wavelength corresponding to its bandgap is absorbed in the absence of defects, the thicker the material, the more expensive it is, and the more heat it traps, while still not guaranteeing that a single traversal of light through the material will result in a successful PV interaction. Moreover, in the presence of defects, if the PV material thickness is greater than the drift diffusion length of light waves, recombination will occur more easily, thus a thinner material favors greater conversion efficiencies.

An alternate mechanism to effectively increase absorption depth without increasing the thickness of the material, is to increase the number of repeat traversals through the material. In fact, the methods outlined in this patent, coerce the light of a given wavelength to traverse its matching PV material repeatedly and endlessly, until it is absorbed. This avoids the excess heat generated and trapped in a thick material.

A prior art mechanism to force multiple traversals of light of a given wavelength through solar material is to employ reflective coatings on both sides of the material, so that light never exits the material until it is absorbed. While this is feasible for single junction solar cells, it gets increasingly difficult to add multiple coatings sandwiched between multi-junction materials that target light from different wavelengths. Also, if light of the target wavelength does escape the material, there is no way for it to be redirected back to it. The approach of this invention alleviates the need to sandwich increasing layers of coating material between the already numerous layers of a multi-junction cell and avoids the heat generated and trapped between the layers. It also allows for multiple opportunities for light of the target wavelength to revert back to the intended PV material.

One deficiency of the approach of this invention could be that the multiple entries and exits from the material, could result in energy lost from surface defects and surface recombination. These losses can however be minimized by sufficiently passivating each surface where light transitions between material and air and vice versa to reduce the effective surface combination velocity.

Excitation efficiency in the design of this invention is increased by forcing light of each relevant wavelength of interest through material of corresponding energy bandgap, until the light successfully excites electrons to create more electricity. Solar thin-films are arranged in pairs with the first pair having the largest bandgap and successive pairs having decreasing bandgaps. In contrast to multi-junction cells, this invention's design to force multiple traversals through material is just as practical for multiple wavelengths in increasing order of wavelength (decreasing order of energy) as it is for one wavelength. Also, due to the relative ease of adding additional layers of different materials to capture a variety of wavelengths, the solar spectrum can be more fully utilized far more easily than in the case of heterojunction cells.

Similarly, drift diffusion efficiency is increased by using the approach of this invention. By keeping each layer of material thin, the probability of radiative and other recombination loss occurrence, prior to successful capture by the solar cell's electric field of the electron released due to PV excitation, is minimized.

Charge separation efficiency is enhanced in the design of this approach because each thin-film of a pair is kept relatively thin, therefore the electric field experienced by a free electron (or a hole) is much stronger than that felt in an equivalent thicker single junction or heterojunction cell. This increases the probability that the free charge will be captured by the circuit and converted to electricity, resulting in a higher collection efficiency.

Each of the factors in the efficiency equation above are enhanced as compared with their comparable prior-art solar cells, resulting in an overall increase in energy conversion efficiency.

SUMMARY

By arranging transparent PV thin-films in a deliberate spatial configuration that traps light of successively longer wavelengths forcing multiple traversals of light through a PV film of matching bandgap for each given wavelength, thereby increasing the probability of absorption and excitation via a decreased probability of radiative recombination, the solar PV conversion efficiency of the composite solar cell is expected to increase significantly, with comparatively less material, less manufacturing complexity, hence cost and less wasteful and energy-conversion-inefficient thermal energy generated between layers as compared with a heterojunction solar PV cell.

In one embodiment, this spatial configuration includes pairs of PV thin-films, the topmost pair comprising of identical PV material whose bandgap matches a targeted range of small wavelengths (higher energy) in the solar spectrum. Each subsequent pair is comprised of PV materials with bandgaps corresponding to increasingly larger wavelengths (smaller energies).

The top surface of the top film in each pair and the bottom surface of the bottom film in each pair, is coated with materials that selectively transmit higher wavelengths down to the next pair, while confining the target wavelengths to reflect between the top and bottom films of the matching pair until the light that has these wavelengths is successfully absorbed by one of the films in the pair.

In another embodiment, a thicker transparent PV film is coated on its top and bottom surfaces to retain within it, the light of wavelengths with a matching bandgap, while transmitting light with greater wavelengths on downward to subsequent transparent PV films with correspondingly matched bandgaps.

In either embodiment, a conductive trellis lends structural integrity to the solar sandwich by holding the PV layers together at predefined separations. It also serves to create an electric field to cause sufficient drift/diffusion of minority carriers and whisk away electrons generated in any given PV film to complete the circuit. This enables PV generation to continue, triggered by photons that impact the top-most layer and make their way down the solar sandwich, while getting progressively absorbed in order of decreasing energy through subsequent layers or pairs of layers. Air gaps between the PV films allow the natural flow of air between layers allowing for natural cooling effects that prevent heat build-up that can occur within conventional cells, e.g. that which may occur between layers within an otherwise high efficiency heterojunction solar cell.

BRIEF DESCRIPTION OF THE DRAWINGS

The specifics of the present application will be explained in more detail with reference to the example embodiments and views shown in the drawings.

DETAILED DESCRIPTION

Figure 1:
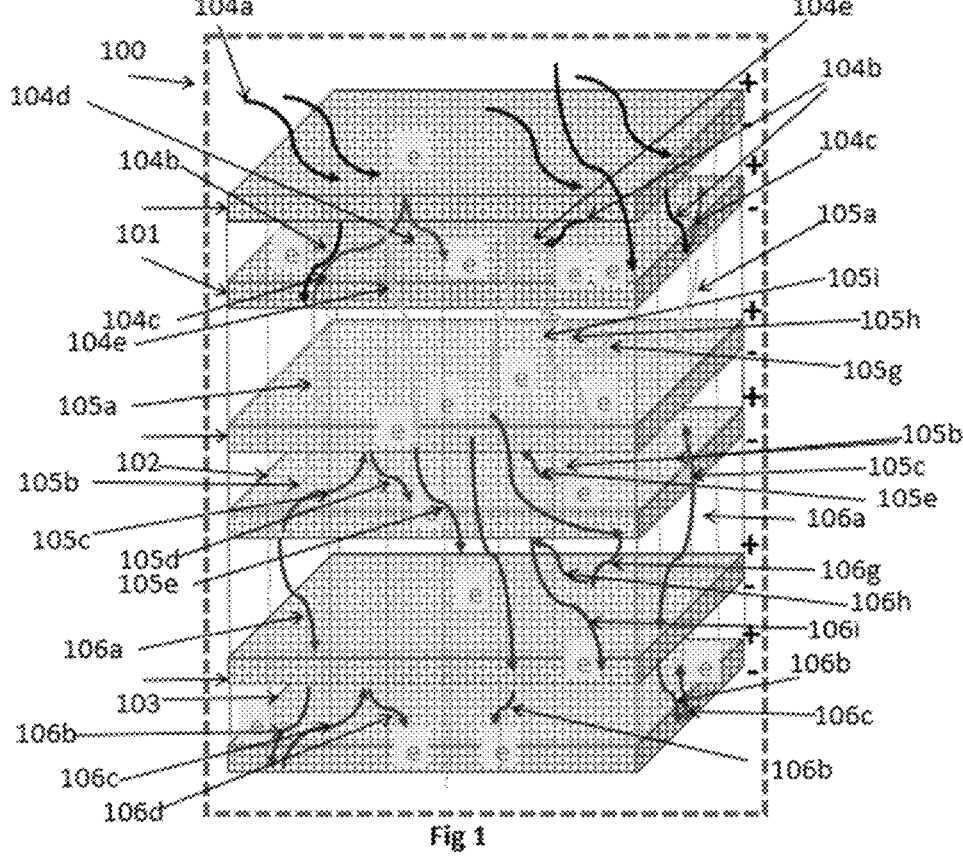
FIG. 1 is a schematic showing the high-level solar sandwich cell design composed of matched thin-film pairs, consecutive pairs with bandgaps matching the wavelengths they target to convert to electricity.

FIG. 1 is a schematic showing the high-level solar sandwich cell design 100 composed of matched thin-film pairs that target conversion of subsets of the solar spectrum to electricity with high efficiency by {i} matching the wavelength of light to the bandgap of the matched thin-film pair, and progressively targeting longer wavelengths down the sandwich, matched pairs separated from other matched pairs by layers of air to allow for reflection of light and dissipation of heat, {iii} members of a matched pair separated from each other by a layer of air to allow for reflection of light and dissipation of heat, {iv} the opportunity for multiple attempts at conversion of light into electricity by trapping light of a specific wavelength between the matched pair of thin-films. White light comprising the entire solar spectrum 104a is incident on the top surface of the upper layer of the uppermost matched pair 101 made with PV material with the highest bandgap tuned to the shortest target wavelength. Some of the light transmits unaffected through the upper layer 104b. Yet other light transmits into the lower layer of the matched pair. When it hits the bottom edge of this layer, light of the lowest wavelength (highest energy) 104c bounces back upward toward the uppermost matched pair, allowing it re-traverse material with the correct bandgap.

Here it bounces back and forth between the matched pair appropriate for this wavelength, until it is absorbed e.g. 104d and converted into electricity. At the same time when light of the lowest wavelength 104c bounces back upward, the remaining light of longer wavelengths transmits 105a downward towards the lower matched pairs that have energy bandgaps suited for longer wavelengths (lower energy). Additionally, when light comprising the entire solar spectrum 104a impinges on the top layer of the uppermost matched pair, some of the light with wavelengths capable of exciting electrons across the largest energy bandgaps does its work right away creating electricity, while light with longer wavelengths 104e is transmitted on downward towards the subsequent matched pairs in the sandwich that are tuned to lower energy light. As the longer wavelength light 105g makes its way downward to the second matched pair 102, some of it may reflect 105h back upward. If this were to occur, the coatings on the underside of the upper matched pair would reflect the light back downward 105i where it, can be useful for conversion into electricity by exciting electrons across matched bandgaps, Once again the light of wavelengths pertinent to the second matched pair is confined 105c, 105d, to reflect between these layers 102, while transmitting longer wavelengths 106a downward towards PV thin-film layers with bandgaps matched to longer wavelengths. Eventually all the light of this wavelength is absorbed 105d in layers 102 by exciting electrons across the matched bandgap which is lower in energy than that for the upper layers 101 but matched perfectly to the wavelength of the light that excites electrons across the bandgap. This process repeats itself for the lower layers of the solar sandwich whose subsequent matched pairs are made from material of lower bandgaps to match light of longer wavelengths (lower energy).

Figure 2:
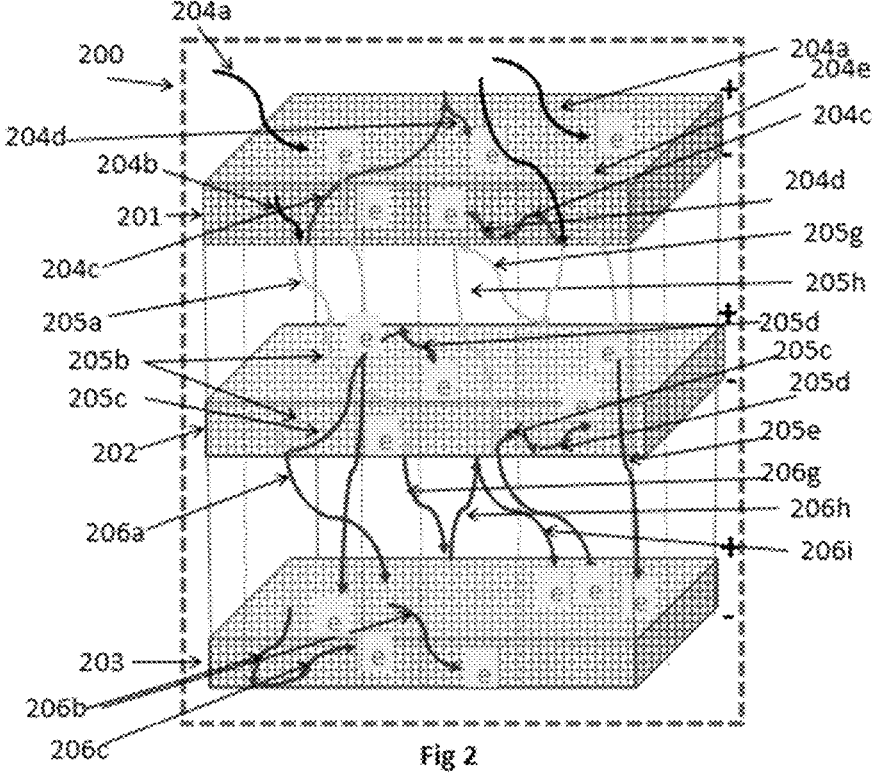
FIG. 2 is a schematic showing the high-level solar sandwich cell design composed of single layer matched PV thin-films with bandgaps matching the wavelengths they target to convert to electricity.

FIG. 2 is a schematic showing the high-level solar sandwich cell design 200 composed of single layer matched PV thin-films each targeting conversion of a subset of the solar spectrum to electricity with high efficiency via {i} matching the wavelength of the targeted light to the bandgap of the thin-film material, and progressively targeting longer wavelengths down the sandwich, {ii} each thin-film separated from the next thin-film by a layer of air to allow for reflection of light and dissipation of heat, {iii} the opportunity for multiple attempts at conversion of light of each wavelength into electricity by trapping light via multiple reflections within each thin-film layer until absorbed. White light comprising the entire solar spectrum 204a is incident on the top surface of the uppermost single layer 201 made with PV material with the highest bandgap tuned to the shortest target wavelength. The light transmits into the upper layer 204b. When some of this light hits the bottom edge of this layer, light of the lowest wavelength (highest energy) 204c bounces back upward and remains within this PV thin-film, allowing it to re-traverse material with its matched bandgap. Here it bounces back and forth within this layer appropriate for its wavelength, e.g. 204c and 204d until it is absorbed and converted into electricity 204d. At the same time when light of the lowest wavelength 204c bounces back upward, the remaining light of longer wavelengths transmits 205a downward towards the lower single layers that have energy bandgaps suited for longer wavelengths (lower energy). Additionally, when the light comprising the entire solar spectrum 204a impinges on the top single layer matched PV thin-film, some of it with wavelengths capable of exciting electrons across the largest energy bandgaps does its work right away creating electricity, while light with longer wavelengths 204e is transmitted on downward towards the subsequent single layer PV thin-film that is tuned to lower energy light in the sandwich. As the longer wavelength light makes its way downward to the second layer 202, some of it may reflect 205g back upward. If this were to occur, the coatings on the underside of the upper matched pair would reflect the light back downward 205h where it can be useful for conversion into electricity by exciting electrons across matched bandgaps. Once again the light of wavelengths pertinent to the second layer is confined 205c, 205d, to reflect within the single layer 202, while transmitting longer wavelengths 206a downward. Eventually all the light of this wavelength is absorbed 205d in layer 202 by exciting electrons across the matched bandgap which is lower in energy than that for the upper layer 201. This process repeats itself for lower layers e.g., 203 within the sandwich whose matched pairs are made from material of lower bandgaps to match light of longer wavelengths (lower energy).

Figure 3:
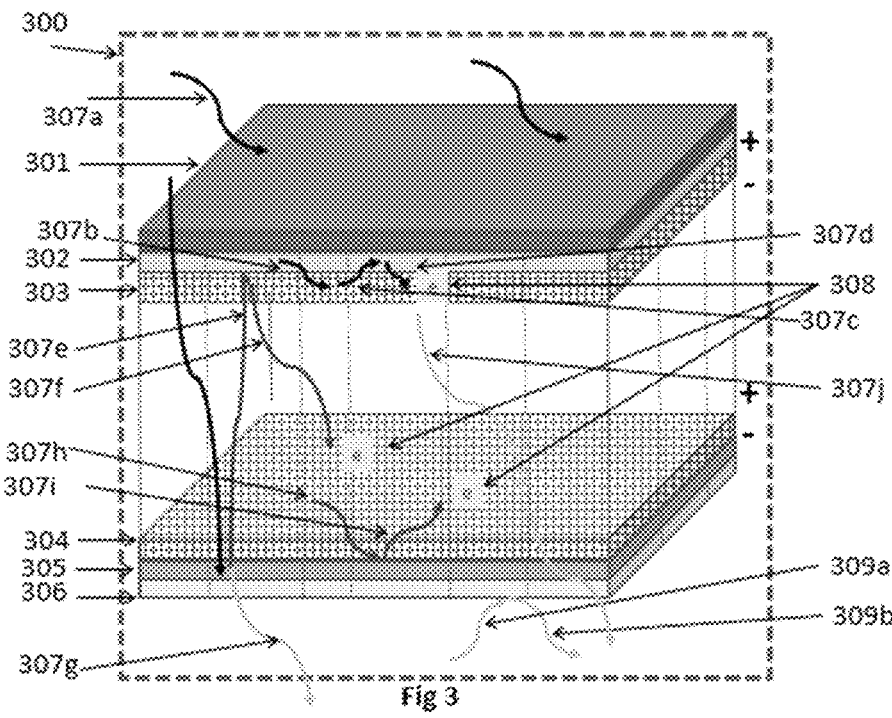
FIG. 3 is a schematic of a matched pair of PV thin-films showing the coatings needed to reflect, filter and transmit light selectively for each successive pair of thin-films.

FIG. 3 is a schematic of a matched pair of PV thin-films showing the coatings needed to reflect and filter light selectively for each successive pair of thin-films in the solar sandwich 300. 301 is a coating that allows all wavelengths to pass through and none to be reflected. It can be textured as necessary to prevent reflection back upward. 302 allows all waves (with all wavelengths) hitting it from below to be reflected downward. 303 and 304 are a matched pair of thin-films that convert light of a specific wavelength into electricity. They are also passivated on both sides to minimize surface recombination. 305 when hit from above by waves of wavelengths targeted for the first two layers, reflects them back up to confine them to bounce between these layers. It allows all other wavelengths to pass through. 306 when hit from below by waves of longer wavelengths targeted for lower layers (with lower energy), reflects them back down towards those layers of the sandwich, while allowing shorter wavelengths to pass back upwards. When white light comprising the entire solar spectrum 307a is incident on the top surface it transmits through 307b into the top layer of the matched pair. If any of it tries to leave the confines of the matched pair, it is reflected back 307c and 307d to bounce between the two layers until it is absorbed and successfully excites electrons 308 across the matched energy bandgap for the shortest wavelengths, while light of longer wavelengths passes through to the next matched pair 307j. Light of longer wavelengths is allowed by coating 305 to leave 307g the confines so that it can excite electrons across smaller bandgaps, while the shorter wavelength light remains and bounces 307e and 307f, 307h and 307i between the 2 thin-films of the matched pair until it excites electrons 308. Longer wavelength light attempting to make its way back into the region of the first matched pair tuned to shorter wavelengths, is reflected back downward 309a and 309b by coating 306 where it can be useful. In subsequent matched pairs, the coatings equivalent to 301 and 302 will selectively allow longer wavelengths (as defined by the matched pair they belong to) to pass through into the confines of the next matched PV thin-film pair while reflecting shorter wavelengths back upwards.

Figure 4:
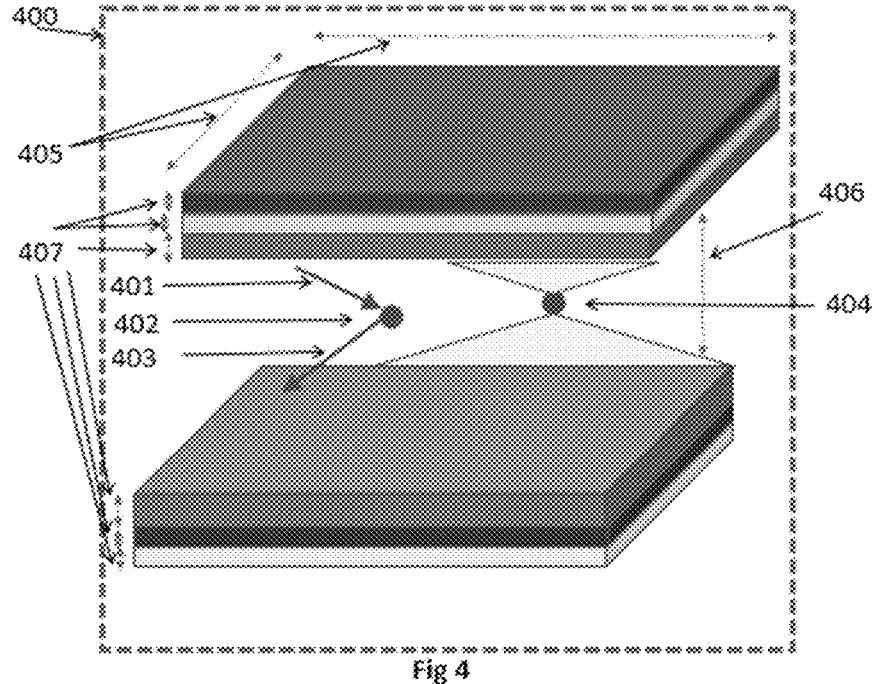
FIG. 4 is a schematic that shows how light may scatter off of air molecules and as a result impinge on the thin-film from which it just exited or its matched pair, hence demonstrating the benefit of two parallel PV thin-films that confine light of their matching desired wavelength to reflect between them until absorbed and converted into electricity.

FIG. 4 is a schematic 400 that shows how light 401, 403 may scatter off of air molecules 402 and as a result impinge on the thin-film from which it just exited or its matched pair, hence demonstrating the benefit of two parallel PV thin-films that confine light of their matching desired wavelength to reflect between them until absorbed and converted into electricity. For any scattering event, the probability that a light wave "leaks" out along the edges of the solar cell is a subset 404 of $4\pi$ steradians which is the total number of steradians in 3D around any given molecule off which the light wave scatters. The smaller the ratio of the gap 406 between the two thin-films to the dimensions of the thin-films 405, the smaller the probability that the light waves will leak out before being converted to electricity. Based on PV thin-film material selection and corresponding bandgaps for conversion efficiency, LCOE can be optimized by optimizing the dimensions of thin-films 405, coatings 407 and separations 406.

What is claimed is:

1. A photovoltaic (PV) system comprising:
   a. A layered sandwiched structure comprised of a plurality of transparent or translucent PV thin-film pairs arranged in layers, with each transparent or translucent PV thin-film pair consisting of two identical transparent or translucent PV thin-films layered in parallel, separated in space by air from each other and from the other transparent or translucent PV thin-film pairs in the layered sandwiched structure, and with each transparent or translucent PV thin-film pair characterized by a unique energy bandgap; and
   b. With a member of each transparent or translucent PV thin-film pair characterized by said unique energy bandgap identical to an energy bandgap of the other member of each transparent or translucent PV thin-film pair, and with the unique energy bandgap of each transparent or translucent PV thin-film pair progressively decreasing in magnitude from a top-most transparent or translucent PV thin-film pair to a bottom-most transparent or translucent PV thin-film pair in the layered sandwiched structure, to target absorption of light with progressively longer wavelengths as sunlight traverses down the layered sandwiched structure.

2. The system of claim 1 wherein each member of each transparent or translucent PV thin-film pair is optically thin and passivated on both sides to minimize recombination and utilizes multiple reflections between both members of each transparent or translucent PV thin-film pair that are separated by said air thereby increasing conversion efficiency for light of a given wavelength which matches the unique energy bandgap of each transparent or translucent PV thin-film pair.

3. The system of claim 1 further comprising multiple coatings on a top surface of a top member of each transparent or translucent PV thin-film pair and on a bottom surface of a bottom member of each transparent or translucent PV thin-film pair to enable the light of a given wavelength which matches the unique energy bandgap of each transparent or translucent PV thin-film pair to bounce continually between said members of each transparent or translucent PV thin-film pair while enabling light of longer wavelengths to be transmitted downward through the layered sandwiched structure to each transparent or translucent PV thin-film pair below, and enabling light of shorter wavelengths to be reflected upward through the layered sandwiched structure to each transparent or translucent PV thin-film pair above.

4. The system of claim 1 wherein the air between said member and the other member of each transparent or translucent PV thin-film pair dissipates wasted thermal energy to improve the conversion efficiency of light to electricity.

5. The system of claim 1 further comprising a battery to store electricity.

6. The system of claim 1 further comprising a load in a circuit which uses electricity.

7. The system of claim 4 further comprising a mechanism by which the air between said member and the other member of each transparent or translucent PV thin-film pair can transport the wasted thermal energy to a heat sink for conversion into useful energy.

8. The system of claim 1, further comprising a conducting trellis along each transparent or translucent PV thin-film pair to create and maintain an electric field that whisks electrons away as they are created, while also serving to create a skeletal structure to hold each transparent or translucent PV thin-film pair in a spatial configuration to maximize the conversion efficiency from said light to electricity.

\* \* \* \* \*